United States Patent

Folberth et al.

[11] Patent Number: 6,043,436
[45] Date of Patent: Mar. 28, 2000

[54] WIRING STRUCTURE HAVING ROTATED WIRING LAYERS

[75] Inventors: Harald Folberth, Boblingen; Jørgen Koehl, Schonbuch; Bernhard Korte, Bonn; Erich Klink, Schonaich, all of Germany

[73] Assignee: International Business Machines Corporation, Armonk, N.Y.

[21] Appl. No.: 08/808,923

[22] Filed: Feb. 28, 1997

[30] Foreign Application Priority Data

Dec. 16, 1996 [DE] Germany ............................ 196 52 258

[51] Int. Cl.$^7$ ........................................................ H05K 1/00
[52] U.S. Cl. .............................. 174/250; 174/36; 174/261
[58] Field of Search .................................. 174/250, 261, 174/34, 260, 36; 361/778, 792, 805, 794; 257/503

[56] References Cited

U.S. PATENT DOCUMENTS

| | | | |
|---|---|---|---|
| 4,782,193 | 11/1988 | Linsker | 174/261 |
| 4,785,135 | 11/1988 | Ecker et al. | 174/34 |
| 5,742,086 | 4/1998 | Rostoker et al. | 257/300 |

*Primary Examiner*—Kristine Kincaid
*Assistant Examiner*—Kamand Cuneo
*Attorney, Agent, or Firm*—H. Daniel Schnurmann

[57] ABSTRACT

An improved wiring structure to minimize coupling between the wiring in one metalization layer of an integrated circuit chip and the wiring in an adjoining metalization layer is described. Wiring in one layer is rotated by an angle $a_1$ with respect to the direction of the wiring in the adjoining layer. By successively rotating all the conductors of one wiring layer with respect to the wiring of the next layer, the capacitive and inductive coupling between conductors in the various layers is minimized, thereby improving the overall high-frequency performance of the chip.

5 Claims, 6 Drawing Sheets

WIRING DIRECTIONS

FIG. 1
(PRIOR ART)

WIRING DIRECTIONS

| METALIZATION LAYERS | STRUCTURE I |
|---|---|
| M5 | — |
| M4 | \| |
| M3 | — |
| M2 | \| |
| M1 | — |
| M0 | \| |

| STRUCTURE I<br>CONDUCTOR 2 | COUPLING COEFFICIENTS | |
|---|---|---|
| | $Kl+Kc$ | $Kl-Kc$ |
| 1→2 | 1.12 | 0.44 |
| 3→2 | 1.16 | 0.48 |
| 4→2 | 0.66 | 0.65 |
| 5→2 | 0.67 | 0.66 |
| 6→2 | 0.67 | 0.66 |
| 7→2 | 0.24 | 0.23 |
| 8→2 | 0.37 | 0.36 |
| 9→2 | 0.44 | 0.43 |
| $Vne$(CONDUCTOR 2-M3) | 1100mV/940mV | |
| $Vfe$(CONDUCTOR 2-M3) | 815mV/650mV | |

TABLE 1

FIG. 3

WIRING DIRECTIONS

| METALIZATION LAYERS | STRUCTURE IIa | STRUCTURE IIb | STRUCTURE IIc |
|---|---|---|---|
| M6 | / | | | | |
| M5 | \ | \ | \ |
| M4 | / | / | / |
| M3 | — | — | — |
| M2 | \ | \ | | |
| M1 | \ | / | — |
| M0 | \ | — | | |

| STRUCTURE II CONDUCTOR 2' | COUPLING COEFFICIENTS | |
|---|---|---|
| | $Kl+Kc$ | $Kl-Kc$ |
| 1'→2' | 1.12 | 0.44 |
| 3'→2' | 1.16 | 0.48 |
| 7'→2' | 0.24 | 0.23 |
| 8'→2' | 0.37 | 0.36 |
| 9'→2' | 0.44 | 0.43 |
| $Vne$(CONDUCTOR 2'-M3) | 700mV/530mV | |
| $Vfe$(CONDUCTOR 2'-M3) | 400mV/230mV | |

TABLE 1

| STRUCTURE II | COUPLING COEFFICIENTS | |
| CONDUCTOR 5' | $Kl+Kc$ | $Kl-Kc$ |
| --- | --- | --- |
| 4' → 5' | 1.12 | 0.44 |
| 6' → 5' | 1.16 | 0.48 |
| $Vne$(CONDUCTOR 5'-M5) | 480mV | |
| $Vfe$(CONDUCTOR 5'-M5) | 190mV | |

TABLE 1

WIRING STRUCTURE HAVING ROTATED WIRING LAYERS

FIELD OF THE INVENTION

The present invention describes an improved wiring structure for high performance chips to reduce inductive and capacitive couplings between the conductors in the different layers of wiring.

BACKGROUND

Constant efforts are undertaken to increase the productive power of chips. A particular problem occurs here with the interference occurring between the individual conductors. If the conductor density increases in the various layers of the chip, the problem of interference couplings or cross-talk between the conductors becomes more significant. These interferences arise from the voltages induced in a conductor at no load through the switching of currents in other parallel, closely associated current-carrying conductors. The unfavorably influenced conductors lie in a close range, the effective radius of which around a current-carrying conductor varies with the signal frequency, interference capacity, inductive coupling, source and terminating impedance, dielectric constants, distance to ground and power source level, length over which the conductors run in parallel and other elements. To the extent that more conductors are arranged within a volume, high frequency switching induces voltage levels, which can be erroneously recorded as data, leading to processing errors.

Since densely packed conductors, which lie parallel to one another, are subject to cross-talk, whether from the same or adjacent layers of wiring, the valid region for the radial distance between adjacent conductors for a certain acceptable signal/noise ratio has a minimal value. This distance is usually reduced, if the conductor cross-section is reduced, the distance between the conductors is increased, the length of the coupling shortened, the dielectric constants of the insulators reduced or they are sited close to layers connected to ground. Multi-layer substrates frequently limit the number of signal planes to two layers disposed vertically to one another, adjacent to a ground layer. In another arrangement the signal layers are disposed in groups of four, wherein the conductors of adjacent signal planes are vertical to one another and each group lies between a pair of ground layers. These arrangements are typical triplet structures. Triplet structures are not applicable, however, to chips, since chips do not have voltage-ground layers but only voltage-ground conductors. In addition, these triplet structures are also not applicable to chips, since the metal layers are required almost entirely for signal wiring because of the very high wiring requirements and since the chip geometry is about an order of magnitude smaller than the geometry of a substrate (chip: 1 mm; Substrate: 100 $\mu$m).

The latest generation of chips should contain 7 and more layers of metal. The distances between the conductors are reduced by up to 50% compared with CMOS chips. Capacitive and inductive interference couplings between the conductors in the different layers of wiring present a serious problem for the latest generation of chips.

German Patent DE 38 80 385 discloses a circuit board with an arrangement of tightly packed electric conductors, which are arranged in a substrate. The conductors, which lie in an area of electromagnetic influence, are arranged in parallel or common substrate channels. They converge or diverge either continuously or interrupted, if they proceed along their associated canals. Circuit board structures are conventionally triplet structures, which exhibit minimal coupling. Moreover, triplet structures are not applicable on chip structures.

U.S. Pat. No. 4,782,193 discloses a wiring structure of a chip carrier. The wiring is composed of several layers of wiring, which are connected together. The adjacent layers of wiring are arranged at fixed angles to one another, rotated preferably by about 45°.

The above referred patent relates to the wiring structure within a chip carrier. Chip carriers are characteristically triplet structures, which display minimal coupling. Besides triplet structures cannot be utilized on chips. In addition, the zig-zag structure is not applicable in a chip because of the wiring requirements.

OBJECTS OF THE INVENTION

It is thus the object of the present invention to propose an improved wiring structure for high performance chips, which greatly reduces the capacitive and inductive interference coupling between the non-orthogonally disposed chip metal layers.

SUMMARY

The present invention is directed to an electronic component having a number of wiring layers arranged one on the other. The wiring layers are arranged such that the direction of wiring in each wiring layer is rotated by an angle $\alpha$ from the direction of wiring of any wiring layer that is in a relevant inductive and capacitive interference coupling region.

The advantages of the present invention reside in the fact that an extensive reduction in interference coupling between the individual layers of wiring is achieved. The signal interference is greatly reduced. The wiring density on a chip can be increased. The wiring lengths are shortened and the conductive capacity reduced. As a consequence, there is an increase in the processing speed of the chip.

BRIEF DESCRIPTION OF THE DRAWINGS

The subject matter which is regarded as the invention is particularly pointed out and distinctly claimed in the concluding portion of the specification. The invention, however, may best be understood by reference to the following detailed description of the preferred embodiments and the accompanying drawings in which:

FIG. 1 shows a wiring structure I, as used in the present state of the art.

FIG. 3 shows examples of embodiments IIa, IIb, IIc of the wiring structure II in accordance with the invention.

DETAILED DESCRIPTION OF THE PREFERRED EMBODIMENT

Figure 2:
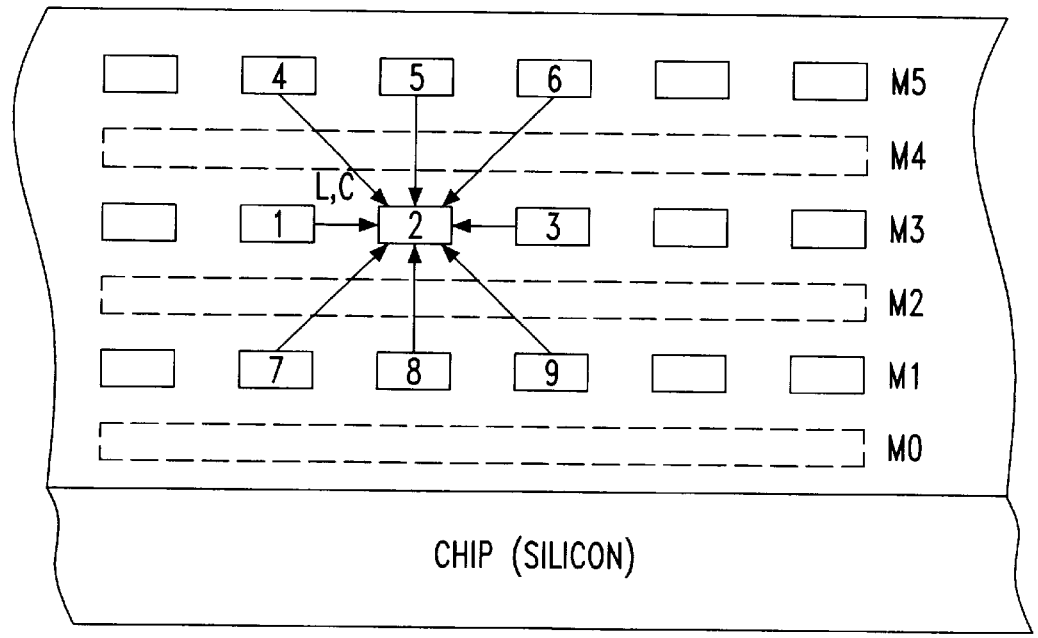
FIG. 2 shows the interference couplings on conductor 2 of the metal layer M3 for a wiring structure I in accordance with FIG. 1.

FIG. 1 shows a state of the art wiring structure I, as presently applied on chips with 6 metal layers. The chip is composed of metal layers M1, M3 and M5, the conductors of which are arranged in the Y direction and metal layers M0, M2, and M4, the conductors of which are arranged in the X direction. As can be seen from FIG. 1, the conductors of the metal layers M1, M3, M5 and the conductors of the metal layers M0, M2, M4 run parallel to one another. Inductive and capacitive couplings between the parallel conductors lead to a signal interference. In present CMOS microprocessor technology with 6 metal layers, long conductors running parallel between the layers of a chip must be avoided, so as to minimize as far as possible the signal interference arising from capacitive and inductive interference couplings between the conductors. This is of even greater importance with the next generation of chips with 7 or more metal layers, since here the distance between the conductors of the individual layers is reduced to approximately 50%.

The following equation describes the interference voltage at the beginning of the conductor and at the end of the conductor for a conductor opposite a metal layer of a parallel conductor of another metal layer:

$$V_{NE,q(t)} = \frac{dV_1}{dt} \cdot \frac{(K_L + K_C)}{2} \times T_d \quad (1)$$

$$V_{FE,q(t)} = \frac{dV_1}{dt} \cdot \frac{(K_L - K_C)}{2} \times T_d \quad (2)$$

$V_{NE}$=interference voltage at the beginning of the conductor $V_{FE}$=interference voltage at the end of the conductor $dV_1/dt$=rise time of signal $K_L$, $K_C$=inductive / capacitive coupling coefficient Td=constants, which relate to the duration of the signal over the coupled length of the conductor Equation (1) describes the interference voltage at the start of conduction of a non-activated conductor. The interference voltage is a function of the rise time of the signal, the sum of the coupling coefficients (Kl+Kc) and the constant (Td), which is derived from the duration of the signal over the coupled length of the conductors.

Equation (2) describes the interference voltage at the end of the conduction of a non-activated conductor. The interference voltage is dependent on the rise time of the signal, the difference of the coupling coefficients and the constant Td. The two interference voltages $V_{NE}$ and $V_{FE}$ are superimposed. Therefore the interference voltage will be above the values given by equations (1) and (2).

TABLE 1

| Structure I | Coupling coefficients | |
| --- | --- | --- |
| Conductor 2 | K1 + Kc | K1 − Kc |
| 1 –> 2 | 1.12 | 0.44 |
| 3 –> 2 | 1.16 | 0.48 |
| 4 –> 2 | 0.66 | 0.65 |
| 5 –> 2 | 0.67 | 0.66 |
| 6 –> 2 | 0.67 | 0.66 |
| 7 –> 2 | 0.24 | 0.23 |
| 8 –> 2 | 0.37 | 0.36 |
| 9 –> 2 | 0.44 | 0.43 |
| Vne(Conductor 2-M3) | 1100 mV/940 mV | |
| Vfe(Conductor 2-M3) | 815 mV/650 mV | |

Metal layers M2 and M4 have negligible inductive and capacitive couplings on conductor 2 of metal layer 3, since the conductors of the metal layers M2 and M4, which run at right-angles to the metal layer M3 and/or the wiring structure, form only a small surface with conductor 2 of metal layer 3. In view of the fact that the metal layers M2 and M4 run at right-angles to M3, there is also no inductive coupling.

With regard to capacitive and inductive interference couplings on conductor 2, the conductors from the metal layers M2 and M4 can thus be neglected. From FIG. 1 and FIG. 2 it can be seen that the conductors 1, 3, 4, 5, 6, 7, 8, 9 of the metal layers M1, M3 and M5 run in parallel with conductor 2 of metal layer 3. The entire interference voltage of conductor 2 at the start of conduction and at the end of conduction is calculated in accordance with the above-mentioned formulae ((1) and (2)).

With regard to conductor 2 of metal layer M3, an interference voltage of 1100 mV is thus obtained at the start of conduction and an interference voltage of 815 mV at the end of conduction with conductors running in parallel for 10 mm. This interference voltage is not acceptable. This applies in particular for the new high performance chips with 7 metal layers (M0–M6) with a separation reduced by around 50% between the individual metal layers.

FIG. 3 shows examples IIa, IIb, IIc of the inventive wiring structure II for the new high performance chip with 7 metal layers (M0–M6). In comparison with the wiring structure I, with wiring structure II in accordance with the invention not only is the neighbouring direction of wiring running in parallel taken into account in the reduction of the capacitive and inductive interference coupling behaviour, but also the further removed, wiring directions running in parallel, insofar as they have a corresponding interference coupling effect on the conductor under consideration. Examples IIa and IIb show, that all wiring structures are arranged rotated at a certain angle $\alpha_1$ with respect to one another. Parallel prothe x-axis (i.e., zero angle). The wiring in M5 is now rotated in a counterclockwise rotation by 60° with respect to the orientation of the wiring in plane M5, resulting in an angle of 120°. Next, the wiring in M4 is rotated by an additional angle of 105° with respect to the wiring in layer M5, resulting in the wiring of layer M5 having an orientation of 225° with respect to the x-axis. Wiring in M3 is then further shifted by 135° with respect to the wiring in layer M4, resulting in an angle with respect to the x-axis of 360° (or 0°). Wiring in layer M2 is now further rotated by another 150° with respect to the wiring in the preceding layer, for an angle of 510° (i.e., 360°+150°) and the wiring in M1 is shifted by 60° with respect to the wiring in layer M2, for an angle of 570° (i.e., 360°+210°). Finally the wiring in M0 is shifted by 90° with respect to M1, for an angle of 660° (360°+300°). All rotations are performed in the same counterclockwise direction. Summarizing, the angles taken by the wiring starting from layer M6 down to M0 are respectively, 60°, 120°, 225°, 360° (i.e., 0°), 510° (i.e., 360°+150°), 570° (i.e., 360°+210°), and 660° (i.e., 360°+300°), that is, a monotonic increase. Whereas the aforementioned angles are described by fixed numbers, e.g, 60°, 225°, as the like, it is clear from FIG. 3 that the numbers may be construed to be approximate to fulfill their intended purpose of minimizing coupling between the wiring of the various layers forming the integrated circuit.

Similarly, in structure IIa, rotations of the wiring with respect to the x-axis (i.e, 0°) lead to a wiring angle of 60°, 120°, 225°, 360° (i.e., 0°), 41° (i.e., 360°+150°), 570° (i.e., 360°+210°), and 675° (i.e., 360°+315°). Finally, with respect to the orientation of the wiring in Structure IIb all the wiring is respectively rotated by 90°, 135°, 225°, 360° (i.e., 0°), 495° (i.e., 360°+135°), 585° (i.e., 360°+225°), and 675° (i.e., 360°+315°).

From the structures shown in FIG. 3 it is evident that the angle representing the orientation of the wiring increases monotonically with respect to the previous layer.

Figure 4:
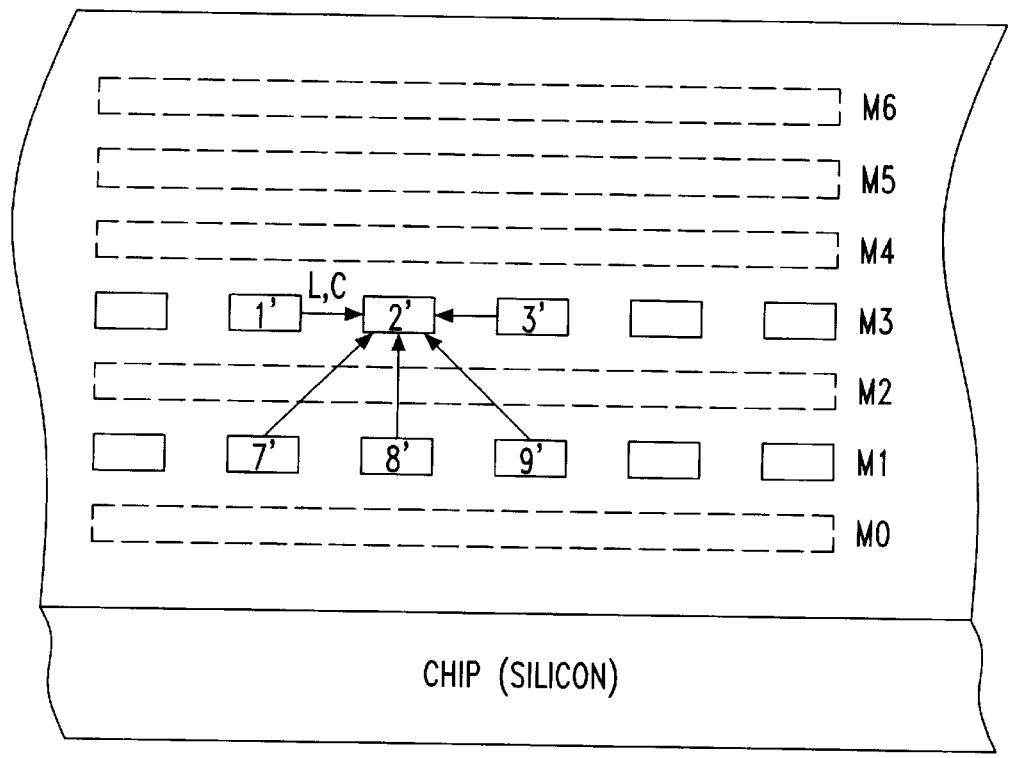
FIG. 4 shows the wiring structure II in accordance with the invention in respect of interference couplings on conductor 2 of metal layer M3.

Table 2 (below) contains the inductive and capacitive coupling coefficients at the start of conduction and at the end of conduction of conductor 2 (in FIG. 4) and the interference voltage on conductor 2' of the metalization layer 3' using the structure IIc in accordance with the invention. FIG. 4 and Table 2 show, that because of the wiring structure II in accordance with the invention, only the conductors 1', 3', 7', 8' and 9' still run in parallel with conductor 2' of metalization layer M3. The interference voltage of 700 mV at the start of conduction and/or 400 mV at the end of conduction on conductor 2' of metalization layer M3 is reduced by almost a factor of 2 compared with wiring structure 1.

TABLE 2

| Structure II | Coupling coefficients | |
| --- | --- | --- |
| Conductor 2' | K1 + Kc | K1 − Kc |
| 1' −> 2' | 1.12 | 0.44 |
| 3' −> 2' | 1.16 | 0.48 |
| 7' −> 2' | 0.24 | 0.23 |
| 8' −> 2' | 0.37 | 0.36 |
| 9' −> 2' | 0.44 | 0.43 |
| Vne(Conductor 2'-M3) | 700 mV/530 mV | |
| Vfe(Conductor 2'-M3) | 400 mV/230 mV | |

There are, however, yet other wiring structures between the individual metalization layers which are possible on the basis of the present invention. For instance the wiring direction can be arranged as in structures IIa and b (FIG. 3). It is thus possible to proceed from the principle, that interference couplings from metalization layer to metalization layer can be essentially reduced, if the wiring direction of each layer is rotated by a certain angle $\alpha_1$ at least with regard to the wiring directions of other layers, which are significant in relation to coupling. The angle should not be less than 10°.

By way of example, the layer of wiring M5 may be rotated by 45° with respect to M6; M4 by about 90° with respect to M5; M3 by about 135° compared with M4, M2 around 90° with respect to M3; M1 around 90° compared with M2, and M0 around 90° compared with M1, all in an anti-clockwise direction. The further the layers are from each other and the shorter the conductors of the corresponding metal layer, the less problematic is the relevance of coupling for the relevant metal layer and/or conductor of the metal layer. Thus, the angle $\alpha_1$ is selected to increase with the distance of the layers moving away from the first layer.

Figure 5:
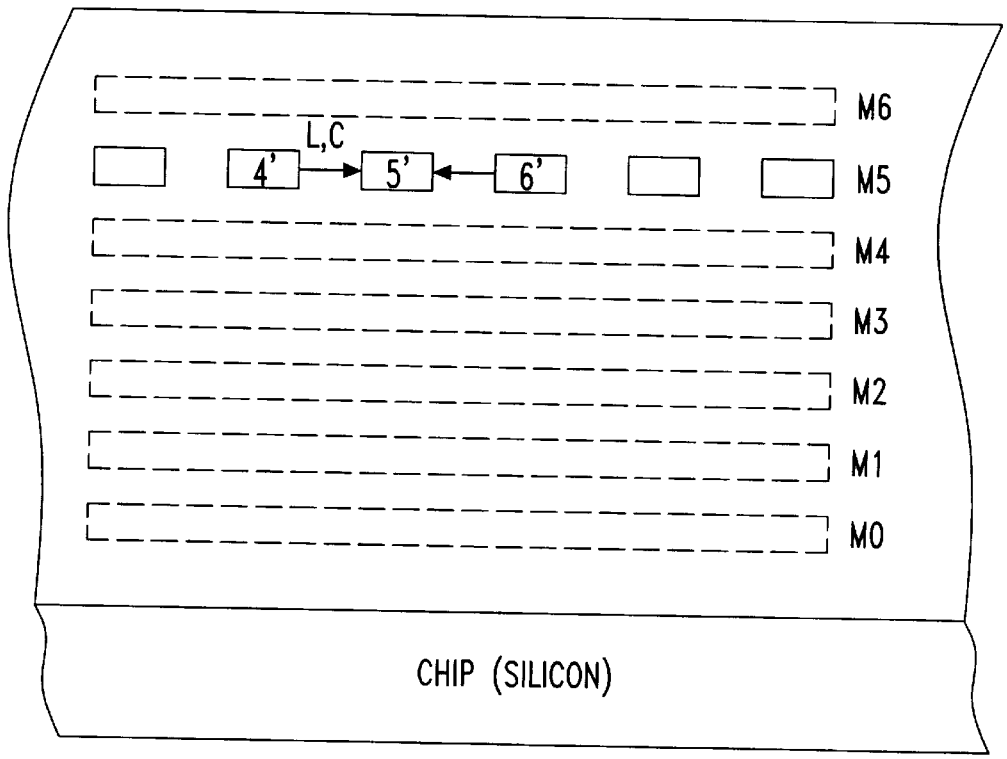
FIG. 5 shows the wiring structure in accordance with the invention in respect of interference couplings on conductor 5 of metal layer M5.

FIG. 5, together with Table 3 (below), shows as a further example the interference couplings on conductor 5' of metal layer 5 in accordance with the wiring structure IIc of the invention. Only the conductors 4' and 6' also on metal layer M5 still produce a relevant interference coupling effect on conductor 5.

TABLE 3

| Structure II | Coupling coefficients | |
| --- | --- | --- |
| Conductor 2 | K1 + Kc | K1 − Kc |
| 4' −> 5' | 1.12 | 0.44 |
| 6' −> 5' | 1.16 | 0.48 |
| Vne(Conductor 5'-M5) | 480 mV | |
| Vfe(Conductor 5'-M5) | 190 mV | |

Figure 6:
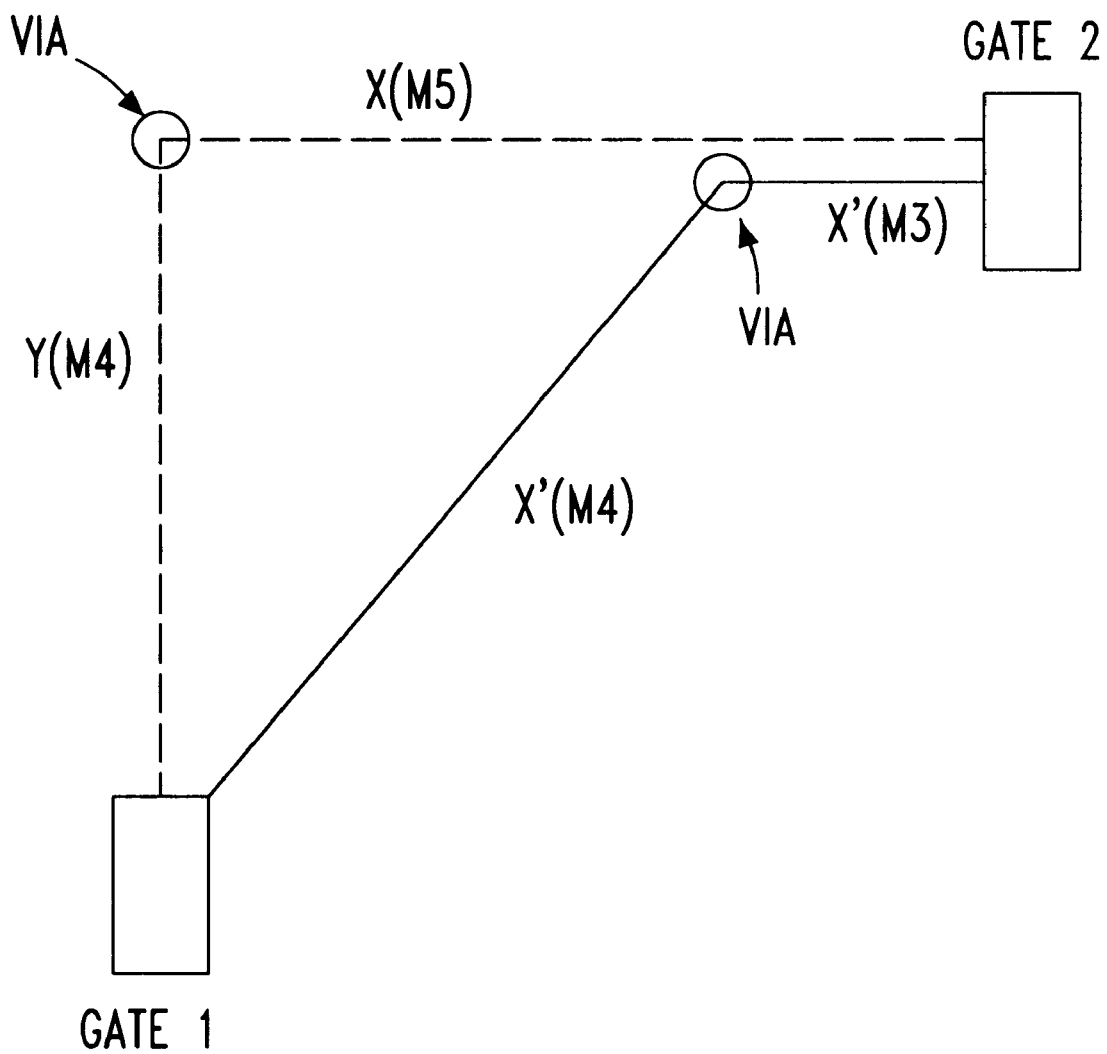
FIG. 6 shows the shortening the lengths of wiring resulting from the wiring structure II in accordance with the invention.

FIG. 6 shows the shortening of the conductor lengths through the wiring structure II in accordance with the invention. As a result of the new wiring structure the conductor lengths in many cases become shorter. In this way the processing speed of the chip is increased. For a two point connection—as shown in FIG. 6—the following equation is obtained for the conductor connection between Gate 1 and Gate 2:

$$L = |x| + |Y| \tag{1}$$

wherein |x| and |y| are respectively the norm of x and y, which in a Euclidean space, represent the length of x and y. In a similar vein, the diagonal line connecting the ends of the lines x and y is the vector sum of x and y.

For a standard chip with the structure I, the length L is the sum of the absolute lengths x and y.

In accordance with the rotation of the wiring directions of the metal layers by 45°, the length L is calculated for the two-point connection as follows;

$$L' = |x| + |y| - (2 - \sqrt{2})\min(|x|, |y|) \tag{2}$$

The total length L and L' is the same in the two equations for x or y=0.

For x>0 and y>0 L' is always less than 1. In the case |x|=|y|, the length reduction totals 30% compared with the standard wiring.

This shows, that the chip productivity is clearly improved by the present invention.

While the invention has been particularyly shown and described with reference to preferred embodiments thereof, it will be understood by those skilled in the art that various other changes in form and detail may be made without departing from the spirit and scope of the invention.

What is claimed is:

1. An integrated circuit chip comprising:

a substrate;

positioned on said substrate, a plurality of contiguous layers M0, M1, M2, M3, M4, M5, and M6 placed one on top of the other, each of said plurality of said layers comprising a plurality of uniformly parallel lines, characterized in that said uniformly parallel lines in each of said layers are rotated with respect to said plurality of uniformly parallel lines in a first one of said layers by an angle $a_1$, said angle $a_1$ varying between at least two of said layers, wherein the value of said angle $a_1$ is determined by said layer's distance from said first layer, and wherein said layer M5 is rotated 45° compared with said layer M6, said layer M4 is rotated 90° compared with said layer M5, said layer M3 is rotated 135° compared with said layer M4, said layer M2 is rotated 90° compared with said layer M3, said layer M1 is rotated 90° compared with said layer M2, and said layer M0 is rotated 90° compared with said layer M1.

2. The integrated circuit chip in accordance with claim 1, wherein said layers are metalization layers.

3. The integrated circuit chip in accordance with claim 1, wherein the value of said angle $a_1$ varies between two of said layers.

4. The integrated circuit chip in accordance with claim 1, wherein the value of said angle $a_1$ is related to the vertical displacement of one of said layers with respect to the first one of said layers.

5. The integrated circuit chip in accordance with claim 1, wherein said rotations are in an anti-clockwise direction.

* * * * *